(12) United States Patent
Dobbertin et al.

(10) Patent No.: US 9,252,378 B2
(45) Date of Patent: Feb. 2, 2016

(54) ORGANIC LIGHT-EMITTING COMPONENT

(71) Applicant: OSRAM Opto Semiconductors GmbH, Regensburg (DE)

(72) Inventors: Thomas Dobbertin, Regensburg (DE); Thilo Reusch, Regensburg (DE); Daniel Steffen Setz, Böblingen (DE)

(73) Assignee: OSRAM OLED GmbH, Regensburg (DE)

( * ) Notice: Subject to any disclaimer, the term of this patent is extended or adjusted under 35 U.S.C. 154(b) by 65 days.

(21) Appl. No.: 13/261,884

(22) PCT Filed: Nov. 9, 2012

(86) PCT No.: PCT/EP2012/072240
§ 371 (c)(1),
(2) Date: May 14, 2014

(87) PCT Pub. No.: WO2013/072251
PCT Pub. Date: May 23, 2013

(65) Prior Publication Data
US 2015/0076451 A1 Mar. 19, 2015

(30) Foreign Application Priority Data
Nov. 14, 2011 (DE) ...................... 10 2011 086 277.3

(51) Int. Cl.
*H01L 35/24* (2006.01)
*H01L 51/50* (2006.01)
*H01L 51/52* (2006.01)
*H01L 51/00* (2006.01)

(52) U.S. Cl.
CPC .......... *H01L 51/504* (2013.01); *H01L 51/0096* (2013.01); *H01L 51/5206* (2013.01); *H01L 51/5221* (2013.01); *H01L 51/5268* (2013.01)

(58) Field of Classification Search
CPC ...................................................... H01L 51/504
USPC ........................................... 257/40, E51.001
See application file for complete search history.

(56) References Cited

U.S. PATENT DOCUMENTS 7,138,191 B2   11/2006   Imanishi
7,570,292 B2    8/2009   Hioki
(Continued)

FOREIGN PATENT DOCUMENTS

CN   100527461 C   8/2009
CN   102074656 A   5/2011
(Continued)

OTHER PUBLICATIONS

Brütting, W., et al, "More Light from Organic Light-Emitting Diodes," Europhysics News, vol. 42, No. 4, Jul. 27, 2011, pp. 20-24.
(Continued)

*Primary Examiner* — Anthony Ho
(74) *Attorney, Agent, or Firm* — Slater & Matsil, L.L.P.

(57) ABSTRACT

An organic light-emitting component includes a translucent substrate, on which an optical coupling-out layer is applied. A translucent electrode overlies the coupling-out layer and an organic functional layer stack having organic functional layers overlies the translucent electrode. The organic functional layer stack includes a first organic light-emitting layer on the translucent electrode and a second organic light-emitting layer on the first organic light-emitting layer. The first organic light-emitting layer includes arbitrarily arranged emitter molecules and the second organic light-emitting layer includes anisotropically oriented emitter molecules having an anisotropic molecular structure.

16 Claims, 2 Drawing Sheets

(56) References Cited

U.S. PATENT DOCUMENTS

| | | |
|---|---|---|
| 7,602,118 B2 | 10/2009 | Cok et al. |
| 8,963,127 B2 | 2/2015 | Pieh et al. |
| 9,065,067 B2 | 6/2015 | Forrest et al. |
| 2005/0208332 A1 | 9/2005 | Chin et al. |
| 2007/0046189 A1 | 3/2007 | Hatwar et al. |
| 2007/0063628 A1 | 3/2007 | Cok et al. |
| 2007/0257608 A1 | 11/2007 | Tyan et al. |
| 2008/0218063 A1 | 9/2008 | Greiner |
| 2008/0303415 A1 | 12/2008 | Suzuri et al. |
| 2012/0286258 A1 | 11/2012 | Naraoka et al. |

FOREIGN PATENT DOCUMENTS

| | | |
|---|---|---|
| CN | 102197507 A | 9/2011 |
| JP | 2003344869 | 12/2003 |
| JP | 2006277987 A | 10/2006 |
| JP | 2007035432 | 2/2007 |
| JP | 2008543074 | 11/2008 |
| JP | 2009506513 A | 2/2009 |
| JP | 2011109113 | 6/2011 |
| JP | 2011228238 | 11/2011 |
| WO | 2011132773 | 10/2011 |

OTHER PUBLICATIONS

Do, Y., et al., "Enhanced Light Extraction from Organic Light-Emitting Diodes with 2D SiO2/SiNx Photonic Crystals," Advanced Materials, vol. 15, No. 14, Jul. 21, 2003, pp. 1214-1218.

Sun, Y., et al., "Enhanced Light Out-Coupling of Organic Light-Emitting Devices Using Embedded Low-Index Grids," Nature Photonics, vol. 2, Jul. 11, 2008, pp. 483-487.

Ziebarth, J.M., et al., "Extracting Light from Polymer Light-Emitting Diodes Using Stamped Bragg Gratings," Advanced Functional Materials, vol. 14, No. 5, May 18, 2004, pp. 451-456.

ORGANIC LIGHT-EMITTING COMPONENT

This patent application is a national phase filing under section 371 of PCT/EP2012/072240, filed Nov. 9, 2012, which claims the priority of German patent application 10 2011 086 277.3, filed Nov. 14, 2011, each of which is incorporated herein by reference in its entirety.

TECHNICAL FIELD

An organic light-emitting component is specified.

BACKGROUND

In organic light-emitting diodes (OLEDs), only part of the generated light is coupled out directly. The rest of the light generated in the active region is distributed among various loss channels, for instance in light guided in the substrate, in a transparent electrode and in organic layers as a result of waveguiding effects, and also in surface plasmons that can be generated in a metallic electrode. The waveguiding effects arise, in particular, as a result of the differences in refractive index at the interfaces between the individual layers and regions of an OLED. Typically, in known OLEDs, only approximately one quarter of the light generated in the active region is coupled out into the surroundings, that is to say air, for example, while the emission is deprived by virtue of approximately 25% of the generated light being lost as a result of waveguiding in the substrate, approximately 20% of the generated light being lost as a result of waveguiding in a transparent electrode and the organic layers and approximately 30% being lost as a result of the generation of surface plasmons in a metallic electrode. In particular, the light guided in the loss channels cannot be coupled out from an OLED without additional technical measures.

In order to increase the coupling-out of light and thus the emitted light power, measures are known, for example, for coupling out the light guided in a substrate into emitted light. For this purpose, by way of example, films comprising scattering particles, and films comprising surface structures such as microlenses, for instance, are used on the outer side of the substrate. It is also known to provide a direct structuring of the outer side of the substrate or to introduce scattering particles into the substrate. Some of these approaches, for example, the use of scattering films, are already in use commercially and can be scaled up with regard to the emission area in particular in the case of OLEDs embodied as lighting modules. However, these approaches for coupling out light have the major disadvantages that the coupling-out efficiency is limited to approximately 60%-70% of the light guided in the substrate, and that the appearance of the OLED is influenced significantly, since a milky, diffusely reflective surface is produced by the applied layers or films.

Furthermore, approaches are known for coupling out the light guided in organic layers or in a transparent electrode. However, to date these approaches have not yet become established commercially in OLED products. By way of example, the document Y. Sun, S. R. Forrest, Nature Photonics 2,483 (2008) proposes forming so-called "low-index grids", wherein structured regions comprising a material having a low refractive index are applied to a transparent electrode. Furthermore, it is also known to apply high refractive index scattering regions below a transparent electrode in a polymeric matrix, as is described in U.S. Publication No. 2007/0257608, for example. In this case, the polymeric matrix generally has a refractive index in the region of n=1.5 and is applied wet-chemically. Furthermore, so-called Bragg gratings or phototonic crystals having periodic scattering structures having structure sizes in the light wavelength range are also known, as are described in the documents Ziebarth et al., Adv. Funct. Mat. 14, 451 (2004) and Do et al., Adv. Mat. 15, 1214 (2003), for example.

However, by means of such measures, that proportion of the light generated in the active region of an OLED which is converted into plasmons cannot be influenced or even coupled out.

SUMMARY OF THE INVENTION

Specific embodiments specify an organic light-emitting component comprising two organic light-emitting layers which has an improved efficiency and coupling-out of light.

BRIEF DESCRIPTION OF THE DRAWINGS

Further advantages, advantageous embodiments and developments will become apparent from the exemplary embodiments described below in conjunction with the figures.

In the figures.

Figure 1:
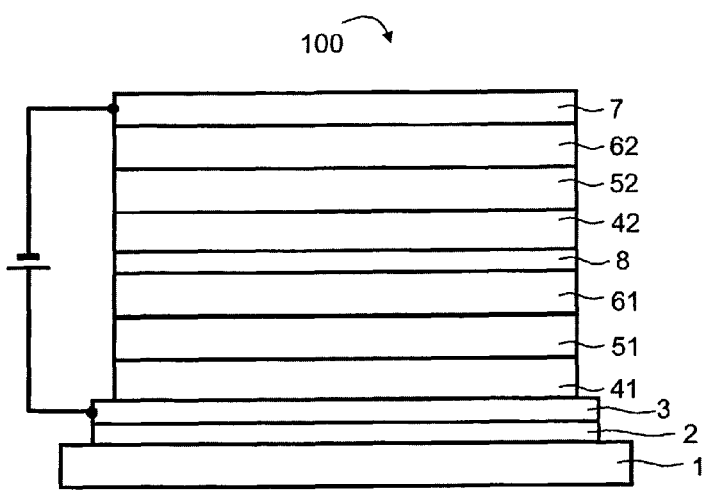
FIG. 1 shows a schematic illustration of an organic light emitting component in accordance with one exemplary embodiment.

In the exemplary embodiments and figures, elements that are identical, of identical type or act identically may be provided in each case with the same reference signs. The illustrated elements and their size relationships among one another should not be regarded as true to scale; moreover, individual elements, such as, for example, layers, structural parts, components and regions, may be illustrated with an exaggerated size in order to enable better illustration and/or in order to afford a better understanding.

DETAILED DESCRIPTION OF ILLUSTRATIVE EMBODIMENTS

In accordance with at least one embodiment, an organic light-emitting component comprises on a substrate a translucent electrode and a reflective electrode, between which an organic functional layer stack is arranged.

Here and hereinafter, "translucent" denotes a layer which is transmissive to visible light. In this case, the translucent layer can be transparent, that is to say clearly translucent, or at least partly light-scattering and/or partly light-absorbing, such that the translucent layer can, for example, also be diffusely or milkily translucent. Particularly preferably, a layer designated here as translucent is embodied such that it is as transparent as possible, with the result that, in particular, the absorption of light is as low as possible.

In accordance with a further embodiment, the organic functional layer stack comprises a first organic light-emitting layer and a second organic light-emitting layer, wherein the first organic light-emitting layer is arranged between the translucent electrode and the second organic light-emitting layer. The organic light-emitting layers are in each case arranged between two charge-carrier-conducting layers, of which one is embodied as a hole-conducting layer and the other is embodied as an electron-conducting layer. By way of example, on the translucent electrode it is possible to arrange an organic hole-conducting layer, thereabove the first organic light-emitting layer and, above the latter, an organic electron-conducting layer. Above the first organic light-emitting layer it is possible to arrange a further organic hole-conducting layer, above the latter the second organic light-emitting layer and thereabove a further organic electron-conducting layer. As an alternative thereto, the organic functional layer stack can also have a structure inverted with respect thereto as regards polarity, that is to say that in this case, as viewed from the translucent electrode, a respective organic electron-conducting layer is arranged below the first and respectively second organic light-emitting layer and a respective organic hole-conducting layer is arranged above the first and respectively second organic light-emitting layer.

In the context of the present invention, a first layer which is arranged or applied "on" a second layer can mean that the first layer is arranged or applied directly in direct mechanical and/or electrical contact on the second layer. Furthermore, an indirect contact can also be designated, wherein further layers are arranged between the first layer and the second layer.

In accordance with a further particularly preferred embodiment, the substrate is embodied in a translucent fashion and the translucent electrode is arranged between the translucent substrate and the organic functional stack, such that light generated in the at least one organic light-emitting layer can be emitted through the translucent electrode and the translucent substrate. An organic light-emitting component of this type can also be designated as a so-called "bottom emitter". By way of example, the substrate can comprise one or more materials in the form of a layer, a plate, a film or a laminate which are selected from glass, quartz, plastic. Particularly preferably, the substrate comprises glass, for example, in the form of a glass layer, glass film or glass plate, or is composed thereof.

In accordance with a further embodiment, the first organic light-emitting layer comprises arbitrarily arranged emitter molecules. That can mean, in particular, that the emitter molecules of the first organic light-emitting layer have a substantially spherical molecular structure or, in the case of a molecular structure having a preferred direction, that is to say an elongated molecular structure, for example, are arranged in a manner facing in arbitrary directions without a preferred direction. In particular, the emitter molecules of the first organic light-emitting layer can be arranged isotropically with regard to their orientation.

In accordance with a further particularly preferred embodiment, the second organic light-emitting layer comprises anisotropically oriented emitter molecules having an anisotropic molecular structure.

Here and hereinafter, an anisotropic molecular structure is understood to mean that the molecules used do not form a substantially spherical molecular structure, but rather an elongated molecular structure. In order to achieve this, emitter molecules having an anisotropic molecular structure comprise, in particular, at least two kinds of different ligands, for example, ligands which differ with regard to their atoms coordinated to a central atom, or have a square-planar environment of the central atom.

The isotropically arranged emitter molecules of the first organic light-emitting layer can comprise or be emitter molecules having an isotropic molecular structure or else can comprise or be emitter molecules having an anisotropic molecular structure which, in contrast to the emitter molecules of the second organic light-emitting layer, are arranged isotropically, that is to say not predominantly along a preferred direction or in a preferred plane.

An organic light-emitting component in accordance with one particularly preferred embodiment comprises the following elements: a translucent substrate, on which an optical coupling-out layer is applied, a translucent electrode on the coupling-out layer, an organic functional layer stack having organic functional layers, comprising a first organic light-emitting layer on the translucent electrode and a second organic light-emitting layer on the first organic light-emitting layer, and thereabove a reflective electrode. The first organic light-emitting layer comprises isotropically arranged emitter molecules, and the second organic light-emitting layer comprises anisotropically oriented emitter molecules having an anisotropic molecular structure.

In one particularly preferred embodiment, the emitter molecules of the second organic light-emitting layer are present in a manner oriented substantially parallel, in particular parallel to the extension plane of the second organic light-emitting layer. In particular, that can mean that the anisotropic emitter molecules of the second organic light-emitting layer, as described further below, have transition dipole moments, also designated hereinafter as dipole moments for short, which are arranged parallel or substantially parallel to the extension plane of the second organic light-emitting layer. "Substantially parallel" can mean, in particular, that more than 66% of the emitter molecules and in particular the dipole moments thereof are oriented parallel. In the case of an anisotropic and in particular in the case of a substantially parallel arrangement of the emitter molecules and in particular their dipole moments, losses as a result of plasmon excitations in the reflective electrode can be considerably suppressed, such that a loss of efficiency in the second organic light-emitting layer as a result of plasmon excitation can therefore be at least partly avoided, as a result of which ultimately the total efficiency of the organic light-emitting component can increase significantly. Accordingly, as a result of the suppression of plasmon excitation as a result of the second organic light-emitting layer, it is possible to increase that proportion of the generated radiation power or of the generated light from the second organic light-emitting layer which is guided in the organic layers and/or the translucent electrode as a result of waveguiding effects. In contrast to plasmons, said proportion can be coupled out at least partly from the organic light-emitting component with the aid of an optical coupling-out layer, as described further below, with the result that, in the case of the organic light-emitting component described here, it is possible to increase the light power emitted through the substrate in comparison with known OLEDs comprising typically isotropically and non-directionally arranged emitter molecules.

In accordance with a further particularly preferred embodiment, the first organic light-emitting layer is at a distance of greater than or equal to 150 nm from the reflective electrode. That can mean, in particular, that the organic functional layers of the organic functional layer stack that are arranged between the first organic light-emitting layer and the reflective electrode have a total thickness of greater than or equal to 150 nm.

In accordance with a further embodiment, the optical length between the first organic light-emitting layer and the reflective electrode for a wavelength of 600 nm, for example, is greater than or equal to 1.6 times 150 nm and less than or equal to 1.8 times 225 nm. In this case, the values 1.6 and 1.8 correspond to a range of preferred refractive index values.

Furthermore, the distance between the first organic light-emitting layer and the reflective electrode can be less than or equal to 225 nm.

Particularly preferably, the distance between the first organic light-emitting layer and the reflective electrode can be greater than or equal to 180 nm and less than or equal to 225 nm.

The inventors have established that the distance between the first organic light-emitting layer and the reflective electrode, as described here, particularly advantageously results in a reduction of that relative proportion of the radiation power generated in the first organic light-emitting layer or of the light generated in the first organic light-emitting layer which is coupled into the reflective electrode in the form of plasmons. In particular, the inventors have established that the distance between the first organic light-emitting layer and the reflective electrode can be chosen in such a way that that relative proportion of the radiation power generated in the first organic light-emitting layer which is coupled into the reflective electrode in the form of plasmons, in particular surface plasmons, is less than or equal to 10%. As already described further above, it is thereby possible to increase that proportion of the generated radiation power or of the generated light from the first organic light-emitting layer which is guided in the organic layers and/or the translucent electrode as a result of waveguiding effects. Said proportion can then be coupled out from the organic light-emitting component at least partly with the aid of an optical coupling-out layer, as described further below. Consequently, in the case of the organic light-emitting component described here, it may be possible to increase the light power emitted through the substrate in comparison with known OLEDs having a typically significantly smaller distance between the at least one organic light-emitting layer and the reflective electrode.

In accordance with a further particularly preferred embodiment, the second organic light-emitting layer is at a distance of greater than or equal to 30 nm and less than or equal to 100 nm from the reflective electrode. That can mean, in particular, that the organic functional layers of the organic functional layer stack that are arranged between the second organic light-emitting layer and the reflective electrode have a total thickness of greater than or equal to 30 nm and less than or equal to 100 nm.

In accordance with a further embodiment, the optical length between the second organic light-emitting layer and the reflective electrode for a wavelength of 600 nm is greater than or equal to 1.6 times 30 nm and less than or equal to 1.8 times 100 nm. In this case, as already mentioned above, the values 1.6 and 1.8 correspond to a range of preferred refractive index values.

Furthermore, the distance between the second organic light-emitting layer and the reflective electrode can be less than or equal to 60 nm.

Particularly preferably, the distance between the first organic light-emitting layer and the reflective electrode can be greater than or equal to 30 nm and less than or equal to 60 nm.

The inventors have established that as a result of the distance between the second organic light-emitting layer and the reflective electrode, as described here, on account of microcavity effects such as, for example, the so-called Purcell effect known to a person skilled in the art, more efficient generation of light is made possible, wherein the plasmon loss channels still present are furthermore suppressed as a result of the above-described anisotropic and in particular parallel arrangement of the emitter molecules.

In accordance with a further embodiment, the second organic light-emitting layer is at a distance of greater than or equal to 100 nm and less than or equal to 200 nm from the first organic light-emitting layer. The distance can be given, in particular, by the total thickness of charge-carrier-conducting layers arranged between the light-emitting layers, and of a charge generation layer described further below.

With regard to the distances between the first and second organic light-emitting layers and the reflective electrode, two degrees of freedom thus arise in the construction of the organic light-emitting component, by virtue of which the two light-emitting layers can be arranged independently of one another at optimum positions with regard to the efficiency-increasing microcavity effects and the plasmon coupling to be avoided between the electrodes. In this case, the plasmon losses are suppressed further as a result of the particular choice of the emitter molecules of the second organic light-emitting layer. In particular, the inventors have discovered that it is possible to effectively combine the effects described here such as the reduction of the plasmon loss channel for the second organic light-emitting layer as a result of the anisotropic arrangement of the emitter molecules of the second organic light-emitting layer, the reduction of the plasmon losses in the first organic light-emitting layer as a result of the advantageous distance with respect to the reflective electrode, and the increase in the generation of radiation as a result of the suitable arrangement of the light-emitting layers with regard to the microcavity effects. Combination of the effects increases, as described above, the relative proportion of the light which is generated in the two light-emitting layers and which is guided in waveguiding loss channels and which can be coupled out in an intensified manner as a result of the arrangement of an optical coupling-out layer described further below.

In accordance with a further embodiment, the organic light-emitting component comprises a charge generation layer sequence between the first and second organic light-emitting layers. The charge generation layer sequence can comprise, for example, an n-doped or electron-conducting region and a p-doped or hole-conducting region, between which an intermediate layer is arranged. The n-doped region and the p-doped region can be embodied, for example, as correspondingly doped layers. Such a charge generation layer sequence is also designated as a "charge generation layer" (CGL). The charge generation layer sequence can be arranged, in particular, between an electron-conducting layer and a hole-conducting layer, such that, by way of example, the electron-conducting layer is arranged between the first organic light-emitting layer and the charge generation layer and a hole-conducting layer is arranged between the charge generation layer and the second organic light-emitting layer, or vice versa. During the operation of the organic light-emitting component, at the CGL electron-hole pairs are generated and separated, and the electrons and holes are made available to the first and second organic light-emitting layer respectively. The CGL thus enables the two light-emitting layers to be stacked one above the other. In other words, this means that the CGL enables the two light-emitting layers deposited one on top of the other to be electrically connected in series.

In accordance with a further embodiment, the intermediate layer of the charge generation layer sequence has a thickness of less than or equal to 4 nm. The thickness can furthermore be greater than or equal to 2 nm. Particularly preferably, the thickness is 2 nm. Such a thin layer thickness can ensure that the intermediate layer is highly transparent independently of its material, which can be a metal oxide, for example.

Furthermore, the intermediate layer of the charge generation layer sequence can also comprise a transparent material having a larger thickness. Independently of the thickness and the material of the intermediate layer, the latter particularly preferably has an absorption coefficient k of less than or equal to 0.005 in the visible spectral range, that is to say for wavelengths of greater than 450 nm.

By way of example, the intermediate layer can be formed by an undoped layer.

The inventors have established that the further embodiments and features described below can affect the efficiency and coupling-out of light of the organic light-emitting component described here with the above-described embodiments and features and in particular the above-described light-emitting layers, such that the embodiments and features described here can in particular also be understood as construction rules for a particularly efficient layer architecture for the organic light-emitting component, which can in particular also be distinguished in terms of their advantageous interaction.

In accordance with a further embodiment, an optical coupling-out layer is applied on the substrate, the translucent electrode in turn being arranged on said optical coupling-out layer. The optical coupling-out layer may be suitable and provided in particular for so-called internal coupling-out, that is to say for reducing that portion of the radiation power generated in the light-emitting layer or of the light which is generated there and which is guided in organic layers and/or in the translucent electrode. Particularly preferably, the optical coupling-out layer can comprise a material which has a refractive index of greater than or equal to 1.6. In particular, it may be advantageous if the refractive index of the optical coupling-out layer is greater than or equal to 1.8 and particularly preferably greater than or equal to 1.85. It is particularly advantageous if the optical coupling-out layer has a refractive index that is greater than or equal to a layer-thickness-weighted average refractive index of the organic functional layers and the translucent electrode.

The optical coupling-out layer can comprise, for example, so-called high refractive index glass, that is to say glass having a refractive index of greater than or equal to 1.8 and particularly preferably greater than or equal to 1.85, for example, having a refractive index of 1.9.

Furthermore, it is also possible for the optical coupling-out layer to comprise an organic material, in particular a polymer-based material, which can be applied to the substrate wet-chemically, for example. For this purpose, by way of example, the optical coupling-out layer can comprise one or more of the following materials: polycarbonate (PC), polyethylene phthalate (PEN), polyethylene terephthalate (PET), polyurethane (PU), polyacrylate, for example, polymethyl methacrylate (PMMA), epoxide.

In accordance with a further embodiment, the optical coupling-out layer is light-scattering. For this purpose, the optical coupling-out layer comprises scattering centers, for example, which are arranged in a manner distributed in one of the abovementioned materials. For this purpose, the abovementioned materials form a matrix material in which the scattering centers are embedded. The scattering centers can be formed by regions and/or particles having a higher or lower refractive index than the matrix material. By way of example, the scattering centers can be formed by particles, for example, $SiO_2$, $TiO_2$, $ZrO_2$, $Al_2O_3$, or by pores, which can be air-filled, for example.

In accordance with a further embodiment, the translucent electrode has a refractive index that is matched to the refractive index of the organic layers and preferably corresponds to the layer-thickness-weighted average value of the refractive indexes of the organic layers. The translucent electrode can have, in particular, a refractive index of greater than or equal to 1.6 and particularly preferably of greater than or equal to 1.7. A refractive index for the translucent electrode in a range of greater than or equal to 1.7 and less than or equal to 2.1 has also proved to be particularly advantageous.

In accordance with a further embodiment, the translucent electrode has a low absorption, in particular in a spectral range of more than 450 nm, for example, in a visible spectral range of between 450 nm and 640 nm. Particularly preferably, the translucent electrode has an absorption coefficient k of less than or equal to 0.005 in such a spectral range. In particular, the total transmission of the translucent electrode should not fall below 80%, and should therefore be greater than or equal to 80%, in the visible spectral range.

In accordance with a further embodiment, the translucent electrode is embodied as an anode and can therefore serve as a hole-injecting material. The reflective electrode is then embodied as a cathode. As an alternative thereto, the translucent electrode can also be embodied as a cathode and thus serve as an electron-injecting material. The reflective electrode is then embodied as an anode. The embodiment of the translucent electrode and of the reflective electrode as anode or cathode depends, in particular, on the above-described construction of the organic functional layer stack.

The translucent electrode can, for example, comprise a transparent conductive oxide or consist of a transparent conductive oxide. Transparent conductive oxides ("TCO" for short) are transparent conductive materials, generally metal oxides, such as, for example, zinc oxide, tin oxide, cadmium oxide, titanium oxide, indium oxide or indium tin oxide (ITO). Alongside binary metal-oxygen compounds, such as, for example, $ZnO$, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stoichiometric composition and can also be p- or n-doped.

In accordance with a further preferred embodiment, the translucent electrode comprises ITO or is composed thereof. In particular, the translucent electrode in this case can have a thickness of greater than or equal to 50 nm and less than or equal to 200 nm. In such a thickness range, the transmission in the visible spectral range of the translucent electrode is greater than or equal to 80% and the resistivity p is in a range of approximately 150 to 500 μΩ·cm.

In accordance with a further embodiment, the reflective electrode comprises a metal, which can be selected from aluminum, barium, indium, silver, gold, magnesium, calcium and lithium, and compounds, combinations and alloys. In particular, the reflective electrode can comprise Ag, Al or alloys comprising these, for example, Ag:Mg, Ag:Ca, Mg:Al. Alternatively, or additionally, the reflective electrode can also comprise one of the TCO materials mentioned above.

Furthermore, it is also possible for the reflective electrode to comprise at least two or more layers and to be embodied as a so-called bilayer or multilayer electrode. By way of example, the reflective electrode can have for this purpose, in a manner facing the organic layers, an Ag layer having a thickness of greater than or equal to 30 nm and less than or equal to 50 nm, on which an aluminum layer is applied. It is also possible for the reflective electrode, as an alternative to metal-metal layer combinations or metal-multilayer combinations, to have one or more TCO layers in combination with at least one metal layer. By way of example, the reflective electrode can have a combination of a TCO layer and a silver layer. It is also possible for a metal layer to be arranged between two TCO layers, for example. In such embodiments, one of the layers or a plurality of layers can also be embodied as nucleation layers.

Furthermore, it is also possible for the reflective electrode to have further optical matching layers for setting the reflectivity or the reflected spectral range. Such optical matching layers can be advantageous in particular in the case of monochromatically emitting light-emitting layers or monochromatically emitting organic light-emitting components. For this purpose, an optical matching layer should advantageously be conductive and can comprise, for example, one or more TCO layers arranged one above another in a Bragg-mirror-like arrangement.

Particularly preferably, the reflective electrode has a reflectivity of greater than or equal to 80% in the visible spectral range.

The reflective electrode can be produced, for example, by means of a physical vapor deposition method (PVD) and/or by means of sputtering.

The organic functional layers between the translucent electrode and the reflective electrode can comprise organic polymers, organic oligomers, organic monomers, organic small, non-polymeric molecules or low molecular weight compounds ("small molecules") or combinations thereof.

In accordance with a further embodiment, one or more charge-carrier-conducting layers, that is to say electron- and/or hole-conducting layers, comprise a dopant. The dopant advantageously increases the conductivity in order that the operating voltage of the organic light-emitting component is kept low.

The inventors have furthermore established that it is particularly advantageous if the organic layers of the organic functional layer stack, in particular those which have a thickness of greater than or equal to 5 nm, have an absorption coefficient k of less than or equal to 0.005 in part of the visible spectral range, that is to say for wavelengths of greater than 450 nm. In particular, this also applies to a hole-conducting layer, which can comprise, for example, a hole transport layer having a thickness of up to 350 nm.

In accordance with a further embodiment, a hole-conducting layer comprises at least one hole injection layer, a hole transport layer or a combination thereof. In particular, doped layers composed of molecular compounds and also doped layers composed of electrically conductive polymers are appropriate as hole transport layer or hole injection layer. By way of example, tertiary amines, carbozole derivates, conductive polyaniline or polyethylene dioxythiophene may prove to be advantageous as materials in particular for a hole transport layer. Furthermore, the following materials may be suitable, for example: NPB (N,N'-bis(naphth-1-yl)-N,N'-bis(phenyl)-benzidine, β-NPB (N,N'-bis(naphth-2-yl)-N,N'-bis(phenyl)-benzidine), TPD (N,N'-bis(3-methylphenyl)-N,N'-bis(phenyl)-benzidine), N,N'-bis(naphth-1-yl)-N,N'-bis(phenyl)-2,2-dimethylbenzidine, DMFL-TPD (N,N'-bis(3-methylphenyl)-N,N'-bis(phenyl)-9,9-dimethylfluorene, DMFL-NPB (N,N'-bis(naphth-1-yl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphth-1-yl)-N,N'-bis(phenyl)-9,9-diphenylfluorene), TAPC (di-[4-(N,N-ditolyl-amino)phenyl]cyclohexane), PAPB (N,N'-bis(phenanthren-9-yl)-N,N'-bis(phenyl)benzidine), TNB (N,N,N',N'-tetra-naphth-2-yl-benzidine), TiOPC (titanium oxide phthalocyanine), CuPC (copper-phthalocyanine), F4-TCNQ (2,3,5,6-tetrafluoro-7,7,8,8,-tetracyanoquinodimethane), PPDN (pyrazino[2,3-f][1,10]phenanthroline-2,3-dicarbonitrile), MeO-TPD (N,N,N',N'-tetrakis(4-methoxyphenyl)benzidine), β-NPP (N,N'-di(naphth-2-yl)-N,N'-diphenylbenzene-1,4-diamine), NTNPB (N,N'-di-phenyl-N,N'-di[4-(N,N-di-tolyl-amino)phenyl]benzidine) and NPNPB (N,N'-di-phenyl-N,N'-di[4-(N,N-di-phenyl-amino)phenyl]benzidine), 1,4-bis(2-phenylpyrimidin-5-yl)benzene (BPPyP), 1,4-bis(2-methylpyrimidin-5-yl)benzene (BMPyP), 1,4-di (1,10-phenanthrolin-3-yl)benzene (BBCP), 2,5-di(pyridin-4-yl)pyrimidine (DPyPy), 1,4-bis(2-(pyridin-4-yl)pyrimidin-5-yl)benzene (BPyPyP), 2,2',6,6'-tetraphenyl-4,4'-bipyridine (GBPy), 1,4-di(benzo[h]quinolin-3-yl)benzene (PBAPA), 2,3,5,6-tetraphenyl-4,4'-bipyridine (TPPyPy), 1,4-bis(2,3,5,6-tetraphenylpyridin-4-yl)benzene (BTPPyP), 1,4-bis(2,6-tetrapyridinylpyridin-4-yl)benzene (BDPyPyP) or mixtures of the abovementioned substances.

A dopant used in this case can be, for example, a metal oxide, an organometallic compound, an organic material or a mixture thereof, for example, $WO_3$, $MoO_3$, $V_2O_5$, $Re_2O_7$ and $Re_2O_5$, di-rhodium tetratrifluoroacetate ($Rh_2(TFA)_4$) or the isoelectronic ruthenium compound $Ru_2(TFA)_2(CO)_2$ or an organic material which comprises aromatic functional groups or is an aromatic organic materials, for example, aromatic materials having a pronounced number of fluorine and/or cyanide(CN)-substituents.

Low molecular weight compounds can be applied, in particular, by thermal evaporation in a vacuum (vacuum thermal evaporation, VTE, or physical vapor deposition, PVD) or from the liquid phase. Polymeric materials can, for example, be applied from the liquid phase or be formed by concatenation of low molecular weight starting materials on the surface of the translucent electrode. A combination of both approaches is likewise possible, in which a thin layer of a p-doped hole injection layer having a thickness of 10 to 20 nm is vapor-deposited on a hole injection layer that was applied by means of a liquid method.

The hole-conducting layer typically has a refractive index of greater than or equal to 1.6 and is particularly preferably in a range of greater than or equal to 1.6 and less than or equal to 1.9.

In accordance with a further embodiment, an electron-conducting layer comprises at least one electron injection layer, an electron transport layer or a combination thereof. By way of example, the following materials may be suitable for the electron-conducting layer: PBD (2-(4-biphenylyl)-5-(4-tert-butylphenyl)-1,3,4-oxadiazole), BCP (2,9-dimethyl-4,7-diphenyl-1,10-phenanthroline), BPhen (4,7-diphenyl-1,10-phenanthroline), TAZ (3-(4-biphenylyl)-4-phenyl-5-tert-butylphenyl-1,2,4-triazole), Bpy-OXD (1,3-bis[2-(2,2'-bipyrid-6-yl)-1,3,4-oxadiazol-5-yl]benzene), BP-OXD-Bpy (6,6'-bis[5-(biphenyl-4-yl)-1,3,4-oxadiazol-2-yl]-2,2'-bipyridyl), PADN (2-phenyl-9,10-di(naphth-2-yl)-anthracene), Bpy-FOXD (2,7-bis[2-(2,2'-bipyrid-6-yl)-1,3,4-oxadiazol-5-yl]-9,9-dimethylfluorene), OXD-7 (1,3-bis[2-(4-tert-butylphenyl)-1,3,4-oxadiazol-5-yl]benzene), HNBphen (2-(naphth-2-yl)-4,7-diphenyl-1,10-phenanthroline), NBphen (2,9-bis(naphth-2-yl)-4,7-diphenyl-1,10-phenanthroline), and 2-NPIP (1-methyl-2-(4-naphth-2-yl)phenyl)-1H-imidazo[4,5-f][1,10]phenanthroline) and mixtures of the above mentioned substances.

A dopant used in this case may be, for example, an alkali metal, an alkali metal salt, an alkaline earth metal salt, an organometallic compound, a molecular doping or a mixture thereof, for example, Li, $Cs_3Po_4$, $Cs_2CO_3$, a metallocene, that is to say an organometallic compound comprising a metal M and two cyclopentadienyl radicals (Cp) in the form $M(Cp)_2$, or a metal-hydropyrimidopyrimidine complex. The metal can comprise or be, for example, tungsten, molybdenum and/or chromium.

By way of example, an electron-conducting layer can comprise an electron transport layer comprising, for example, 2,9-dimethyl-4,7-diphenyl-1,10-phenanthroline (BCP) or 4,7-diphenyl-1,10-phenanthroline (BPhen). This material can preferably comprise a dopant selected from Li, $Cs_2CO_3$, $Cs_3Po_4$ or a molecular doping.

In addition to in each case an organic hole-conducting layer and an organic electron-conducting layer, between which the first organic light-emitting layer and respectively the second organic light-emitting layer are arranged, one or more further organic layers can be present in the organic functional layer stack. In particular, by way of example, a hole-blocking layer can be arranged between an electron-conducting layer and a light-emitting layer. It is also possible for an electron-blocking layer to be arranged between a hole-conducting layer and a light-emitting layer.

In accordance with a further embodiment, the first organic light-emitting layer comprises an electroluminescent material. Suitable materials for this purpose include materials which exhibit radiation emission on account of fluorescence or phosphorescence, for example, polyfluorene, polythiophene or polyphenylene or derivatives, compounds, mixtures or copolymers thereof, for example, 2- or 2,5-substituted poly-p-phenylenevinylene, and metal complexes, for example, iridium complexes such as blue phosphorescent FIrPiC (bis(3,5-difluoro-2-(2-pyridyl)phenyl-(2-carboxypyridyl)-iridium III), green phosphorescent Ir(ppy)3 (tris(2-phenylpyridine)iridium III), red phosphorescent Ru (dtb-bpy (3*2(PF6) (tris[4,4'-di-tert-butyl-(2,2')-bipyridine] ruthenium(III)complex) and blue phosphorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 (4-dicyanomethylene)-2-methyl-6-julolidyl-9-enyl-4H-pyran).

Materials which exhibit both fluorescence and phosphorescence are also possible. The materials of the light-emitting layer can furthermore also utilize so-called singlet or triplet harvesting, known to the person skilled in the art. Depending on the materials of the at least one organic light-emitting layer, the latter can generate monochromatic, dichromatic or polychromatic light, for example, white light.

Alternatively or additionally, the first organic light-emitting layer can also comprise one or more of the materials described below in conjunction with the second organic light-emitting layer, wherein these materials, in contrast to the second organic light-emitting layer, are then arranged isotropically in the first organic light-emitting layer.

In accordance with a further embodiment, the second organic light-emitting layer comprises an electroluminescent material as emitter molecules having an anisotropic molecular structure. Suitable materials for this purpose include anisotropic emitter materials which exhibit radiation emission on account of fluorescence or phosphorescence.

In accordance with a further embodiment, the second organic light-emitting layer comprises a phosphorescent emitter material having an anisotropic molecular structure, selected from iridium complexes, platinum complexes and palladium complexes or from mixtures thereof. In particular, the iridium complexes yield very good quantum efficiencies if they are used as emitter molecules in organic radiation-emitting devices. Furthermore, platinum and palladium complexes also yield very good results since, on account of usually square-planar coordination given the presence of a corresponding matrix material, they can be deposited very easily to form molecular arrangements oriented substantially parallel to one another and to the substrate surface. Generally, however, the phosphorescent emitters are not restricted to these metal complexes; rather, in principle, other metal complexes such as lanthanide complexes, for example, europium complexes, or else gold, rhenium, rhodium, ruthenium, osmium or zinc complexes, are also suitable.

Appropriate emitter materials for the second organic light-emitting layer may include, in particular, the following compounds which have an emission maximum in the blue, green or red spectral range: $Ir(ppy)_2(acac)$=(bis(2-phenylpyridine) (acetylacetonate) iridium (II)), $Ir(mppy)_2(acac)$=(bis[2-(p-tolyl)pyridine]acetylacetonate)iridium(III)), bis[1-(9,9-dimethyl-9H-fluoren-2-yl)-isoquinoline](acetylacetonate) iridium(III), $Ir(mdq)_2(acac)$=(bis(2-methyl-dibenzo[f,h]-quinoxaline) (acetylacetonate)iridium(III)), iridium(III)-bis (dibenzo[f,h]-quinoxaline)(acetylacetonate), $Ir(btp)_2(acac)$= (bis(2-benzo[b]thiophen-2-yl-pyridine) (acetylacetonate) iridium(III)), $Ir(piq)_2(acac)$=(bis(1-phenylisoquinoline) (acetylacetonate)iridium(III)), $Ir(fliq)_2(acac)$-1=(bis[1-(9,9-dimethyl-9H-fluoren-2-yl)-isoquinolin](acetylacetonate) iridium(III)), hex-$Ir(phq)_2(acac)$=bis[2-(4-n-hexylphenyl) quinoline] (acetyl-acetonate)iridium(III), $Ir(flq)_2(acac)$-2= (bis[3-(9,9-dimethyl-9H-fluoren-2-yl)-isoquinoline] (acetylacetonate) iridium(III)), bis[2-(9,9-dibutylfluorenyl)-1-isoquinoline](acetylacetonate)iridium(III), bis[2-(9,9-dihexylfluorenyl)-1-pyridine](acetylacetonate)iridium(III), $(fbi)_2Ir(acac)$=bis(2-(9,9-diethyl-fluoren-2-yl)-1-phenyl-1H-benzo[d]imidazolato)(acetylacetonate)-iridium(III), $Ir(2-phq)_2(acac)$=(bis(2-phenylquinoline)(acetylacetonate) iridium(III)), iridium (III)-bis(2-(2'-benzothienyl)pyridinato-N,C3')(acetylacetonate), $Ir(BT)_2(acac)$=bis(2-phenyl-benzothiazolate)(acetylacetonate)iridium(III), $(PQ)_2Ir$ (dpm)=bis(2-phenylquinoline)(2,2,6,6-tetramethylheptane-3,5-dionate)iridium(III), $(Piq)_2Ir(dpm)$=bis (phenylisoquinoline)(2,2,6,6-tetramethylheptane-3,5-dionate)iridium(III) and iridium(III)bis(4-phenylthieno[3,2-c]pyridinato-N,C2') acetylacetonate and mixtures of the above mentioned substances. As an alternative to the listed complexes comprising iridium, they can also comprise a different metal mentioned above, for example, platinum, palladium, or a lanthanide. For emitter materials which emit in the blue wavelength range, carbene complexes of iridium are appropriate, for example.

In order to produce the second organic light-emitting layer, the emitter molecules with the anisotropic molecular structure can be applied under thermodynamic control, for example, wherein the emitter material, for example, together with a matrix material is evaporated in a vacuum and deposited onto a charge-carrier-conducting layer, that is to say an electron- or hole-conducting layer depending on the arrangement of the functional layers of the organic functional layer stack. The anisotropic orientation of the emitter molecules of the second organic light-emitting layer can be effected by the thermodynamic control.

Here and hereinafter, application under thermodynamic control is understood to mean that, during the deposition of the emitter molecules and, if appropriate, also of the molecules of the matrix material, the deposited molecules are not oriented randomly, rather the orientation takes place at least partly in a preferred direction. Accordingly, the transition dipole moments of the emitter molecules in total also have an anisotropic distribution within the second organic light-emitting layer, which is characterized, in particular, by the fact that more transition dipole moments of the emission process which is a dipole transition are oriented parallel to the layer plane of the second organic light-emitting layer than transition dipole moments which are oriented non-parallel, that is to say orthogonally, for example, with respect thereto. During the thermodynamic control, the molecules interact with their environment, that is to say other molecules, for example, during the deposition or in a later step, such that a reorientation and orientation can take place in which a thermodynamically more favorable configuration can be adopted. Such an anisotropic orientation of the emitter molecules of the second organic light-emitting layer is possible, in particular, if starting materials having an anisotropic molecular structure are selected both for the emitter molecules and for a matrix material into which the emitter molecules in the second organic light-emitting layer are embedded.

The thermodynamic control can be made possible, for example, by a growth rate that is comparatively low, for example, less than or equal to 0.5 nm/s, in particular less than or equal to 0.2 nm/s or even less than 0.1 nm/s, for example, less than 0.05 nm/s or else less than 0.025 nm/s. The growth rate should be understood to mean the rate at which the second organic light-emitting layer is deposited. Furthermore, the thermodynamic control can additionally or alternatively also be achieved by means of a thermal treatment during application or after application in which the second organic light-emitting layer is brought to or kept at an elevated temperature relative to room temperature. The second organic light-emitting layer can be brought to a temperature of between 30° C. and 100° C., for example, wherein the temperatures chosen must not damage the layers of the component that are to be applied or the layers of the component that have already been applied.

After application and, if appropriate, the thermal treatment, the emitter molecules having the anisotropic molecular structure are frozen in their oriented orientation. The emitter molecules and, if appropriate, the molecules of a matrix material can therefore be selected, in particular, such that at room temperature the emitter molecules can no longer be reoriented, for example, as a result of isomerizations of ligands of the emitter molecules.

As an alternative to the thermodynamic control, it is also possible, for example, by means of so-called kinetic control, to "freeze" the emitter molecules in the position in which they interact in each case for the first time with the surface on which they are deposited.

In accordance with a further embodiment, the second organic light-emitting layer comprises a matrix material in which the emitter molecules having the anisotropic molecular structure are embedded or contained.

In accordance with a further embodiment, the matrix material, too, can have an anisotropic molecular structure. An anisotropic orientation of the emitter molecules can additionally be supported by means of such matrix materials. In a manner corresponding to the anisotropic emitter molecules, it also holds true for the matrix material having an anisotropic molecular structure that, in particular, no substantially symmetrically substituted linkage points are permitted to be present here.

In particular, a matrix material having an anisotropic molecular structure is understood to mean a material in which, proceeding from a central branching site, in particular a central atom or a central ring, no three, four or more substituents having an identical or substantially identical structure are present, consideration being given only to substituents which are not hydrogen. An identical structure in this case means that the substituents are identical. A substantially identical structure furthermore means that although the at least three substituents differ with regard to the molecular weight allotted to them, none of the substituents of the branching site has a molecular rate which is at least 50% less than that of one of the other substituents, consideration being given only to substituents which are not hydrogen. Accordingly, molecules having an anisotropic molecular structure are not highly symmetrical molecules having more than two identical substituents or, in the case of branching sites having three or more substituents, for example, branching sites such as tertiary amine nitrogen atoms or at least triply substituted benzene rings, the molecules have very different substituents.

In accordance with a further embodiment, the matrix material can have hole-conducting and/or electron-conducting properties. In particular, the matrix material can comprise or be composed of one or more of the compounds mentioned in conjunction with the hole-conducting and electron-conducting layers.

The first and second organic light-emitting layers can in each case particularly preferably emit visible light in a narrow or wide wavelength range, that is to say monochromatic or multicolored or else, for example, white light. For this purpose, the organic light-emitting layers can comprise one or more organic light-emitting materials. Multicolored or white light can be generated by the combination of different organic light-emitting materials in a respective one of the first and second light-emitting layers or else by a combination of the emitter material of the first organic light-emitting layer and the emitter material of the second organic light-emitting layer. By way of example, one of the two light-emitting layers can emit red and green light, while the other of the two light-emitting layers emits blue light. As an alternative thereto, it is also possible, for example, for both light-emitting layers to generate white light.

Furthermore, an encapsulation arrangement can also be arranged above the electrodes and the organic layers. The encapsulation arrangement can be embodied, for example, in the form of a glass cover or, preferably, in the form of a thin-film encapsulation.

A glass cover, for example, in the form of a glass substrate with a cavity, can be adhesively bonded by means of an adhesive layer on the substrate. Furthermore, a moisture-absorbing substance (getter), for example, composed of zeolite, can be adhesively bonded into the cavity in order to bind moisture or oxygen which can penetrate through the adhesive.

In the present case, an encapsulation arrangement embodied as a thin-film encapsulation is understood to mean a device suitable for forming a barrier in relation to atmospheric substances, in particular in relation to moisture and oxygen and/or in relation to further harmful substances such as, for instance, corrosive gases, for example, hydrogen sulfide. For this purpose, the encapsulation arrangement can comprise one or more layers each having a thickness of less than or equal to a few 100 nm.

In particular, the thin-film encapsulation can comprise or consist of thin layers applied, for example, by means of an atomic layer deposition (ALD) method. Suitable materials for the layers of the encapsulation arrangement are, for example, aluminum oxide, zinc oxide, zirconium oxide, titanium oxide, hafnium oxide, lanthanum oxide, tantalum oxide. Preferably, the encapsulation arrangement comprises a layer sequence having a plurality of the thin layers, each having a thickness of between one atomic layer and 10 nm, inclusive of the limits.

As an alternative or in addition to thin layers produced by means of ALD, the encapsulation arrangement can comprise at least one or a plurality of further layers, that is to say in particular barrier layers and/or passivation layers, deposited by thermal vapor deposition or by means of a plasma-assisted process, for instance sputtering or plasma-enhanced chemical vapor deposition (PECVD). Suitable materials for this may be the abovementioned materials and also silicon nitride, silicon oxide, silicon oxynitride, indium tin oxide, indium zinc oxide, aluminum-doped zinc oxide, aluminum oxide and mixtures and alloys of the materials mentioned. The one or the plurality of further layers can, for example, each have a thickness of between 1 nm and 5 μm and preferably between 1 nm and 400 nm, inclusive of the limits.

Furthermore, in particular in the case of an optical coupling-out layer formed from a polymer, it may be possible that an encapsulation arrangement embodied as a thin-film encapsulation is formed on said optical coupling-out layer below the translucent electrode. In particular in the case of an optical coupling-out layer that is not hermetically impermeable, the organic light-emitting component can thus be sealed and encapsulated from below, that is to say beneath the translucent electrode.

In accordance with a further embodiment, the organic light-emitting component comprises, between the translucent electrode and the first organic light-emitting layer, in addition to the second organic light-emitting layer, at least one or else a plurality of further organic light-emitting layers. As a result, it may be possible that, for example, three, four or more light-emitting layers are present between the electrodes together with the first and second organic light-emitting layers. The organic light-emitting layers, that is to say, for example, the first organic light-emitting layer and a further organic light-emitting layer between the first organic light-emitting layer and the translucent electrode or, for example, two further organic light-emitting layers, between the first organic light-emitting layer and the translucent electrode, can particularly preferably in each case be connected to one another by means of a charge generation layer sequence described further above.

As a result of the combination described here of the first and second organic light-emitting layers with the respective emitter molecules and the respective arrangement of the light-emitting layers in the organic functional layer stack with a respective distance with respect to the reflective electrode that is optimized in the best possible way, the total thickness of the organic light-emitting component described here can be kept small with at the same time a high coupling-out efficiency, as a result of which absorption losses can be kept small.

FIG. 1 shows one exemplary embodiment of an organic light emitting component 100. The latter comprises a substrate 1, on which an optical coupling out layer 2 is applied. Above the optical coupling out layer 2, a translucent electrode 3 and a reflective layer 7 are applied, between which is arranged an organic functional layer stack comprising organic functional layers comprising a first organic light emitting layer 51 and thereabove a second organic light emitting layer 52.

The organic light emitting component is embodied as a so called "bottom emitter" and for this purpose comprises a translucent substrate 1 composed of glass. As an alternative thereto, the substrate 1 can also comprise or be composed of a different translucent material, for example, a plastic or a glass plastic laminate.

For the purpose of effectively coupling out light, the optical coupling out layer 2 has a refractive index that is greater than or equal to a layer thickness weighted average refractive index of the organic functional layers and the translucent electrode 3. In the exemplary embodiment shown, the optical coupling out layer 2 comprises for this purpose glass, in particular high refractive index glass having a refractive index of approximately 1.9. As an alternative thereto, the optical coupling out layer 2 can also be based on a polymer material, as described above in the general part.

Furthermore, the coupling-out layer 2 comprises scattering centers distributed in the glass material in the form of particles or pores which have a higher or lower refractive index than the glass material. In the case of pores, the latter can be air filled, for example, while $SiO_2$, $TiO_2$, $ZrO_2$ and/or $Al_2O_3$, for example, can be used as particles. The optical coupling out layer 2 can bring about the effect that, as described above in the general part, at least part of the light wave guided in the translucent electrode 3 or in the organic layers can be coupled out from the organic light emitting component 100 through the substrate 1.

Furthermore, an encapsulation arrangement can also be arranged above the electrodes 3, 7 and the organic layers, said encapsulation arrangement not being shown for the sake of clarity. The encapsulation arrangement can be embodied, for example, in the form of a glass cover or, preferably, in the form of a thin-film encapsulation, as described above in the general part. Furthermore, in particular in the case of an optical coupling out layer 2 comprising a polymer, it may be necessary for an encapsulation arrangement embodied as a thin-film encapsulation also to be formed on said optical coupling out layer below the translucent electrode 3, as described above in the general part.

The translucent electrode 3 has a refractive index of greater than or equal to 1.6 and preferably of greater than or equal to 1.7 and less than or equal to 2.1. Furthermore, the thickness and material of the translucent electrode 3 are chosen in such a way that the absorption coefficient in a visible spectral range of 450 nm to 640 nm is less than or equal to 0.005. In particular, the transmission of the translucent electrodes 3 in the visible spectral range is greater than or equal to 80%.

In the exemplary embodiment shown, for this purpose, the translucent electrode is composed of indium tin oxide (ITO) having a thickness of greater than or equal to 50 nm and less than or equal to 200 nm. What can also be achieved as a result is that the resistivity of the translucent electrode 3 is in a range of greater than or equal to 150 and less than or equal to 500 μΩ·cm, as a result of which a sufficiently high conductivity of the translucent electrode 3 can be ensured.

In the exemplary embodiment shown, the reflective electrode 7 is composed of metal and comprises, in particular, Ag, Al or alloys such as Ag:Mg, Ag:Ca or Mg:Al. As an alternative thereto, it is also possible for the reflective electrode 7 to comprise at least two or more metal layers or one or more TCO layers in combination with one or more metal layers. By way of example, the reflective electrode 7 can also comprise optical matching layers, for example, composed of a TCO layer stack having a Bragg mirror'like embodiment, in order to match the reflectivity of the reflective electrode 7 to the emission spectrum of the light-emitting layer 5. The reflective electrode 7 has a reflectivity of greater than or equal to 80% in the visible spectral range.

As an alternative thereto, the translucent electrode 3 and/or the reflective electrode 7 can in each case also comprise a different material described above in the general part.

In the exemplary embodiment shown, the translucent electrode 3 is embodied as an anode and the reflective electrode 7 is embodied as a cathode. In accordance with the thereby predefined polarity of the organic light emitting component 100, the first organic light emitting layer 51 is arranged between a hole conducting layer 41 on the side of the translucent electrode 3 and an electron conducting layer 61 above the first organic light emitting layer 51, while the second organic light emitting layer 52 is arranged between a further hole conducting layer 42 below the second organic light emitting layer 52 and a further electron-conducting layer 62 above the second organic light emitting layer 52.

As an alternative to the polarity of the organic light emitting component 100 as shown in the exemplary embodiment in FIG. 1, the component can also have an inverted polarity with respect thereto, in the case of which the translucent electrode 3 is embodied as a cathode and the reflective electrode 7 is embodied as an anode and the arrangement of the hole conducting layers 41, 42 and of the electron conducting layers 61, 62 is interchanged in each case.

The hole conducting layers 41, 42 comprise at least one hole transport layer. Furthermore, the hole conducting layer 41, 42 can additionally comprise a hole injection layer, which can have a thickness in the range of a few tens of nanometers. Both the hole transport and the hole injection layers can be composed of the materials described above in the general part, for example, of low molecular weight compounds ("small molecules") or polymers.

In the exemplary embodiment shown, the electron-conducting layers 61, 62 are conductivity doped in order to ensure a sufficiently high conductivity. In the exemplary embodiment shown, the electron conducting layers 61, 62 in each case comprise an electron transport layer, which can comprise as matrix material, for example, BCP or BPhen, which is doped with Li, $Cs_3Co_4$, $Cs_3Po_4$ or by means of a molecular doping. The electron-conducting layers 61, 62 can alternatively or additionally in each case also comprise one or more further materials as described in the general part.

In addition to the layers shown in FIG. 1, even further organic layers can be present, for example, electron or hole blocking layer between the charge carrier conducting layers 41, 42, 61, 62 and the organic light emitting layers 51, 52.

It is particularly advantageous if those organic layers of the organic functional layer stack which have a thickness of greater than or equal to 5 nm have an absorption coefficient k of less than or equal to 0.005 in part of the visible spectral range, that is to say for wavelengths of greater than 450 nm.

Arranged between the first and the second organic light emitting layers 51, 52 there is a charge generation layer sequence 8, which is also designated as "charge generation layer" (CGL) and enables the first and second organic light emitting layers 51, 52 to be arranged electrically in series on one another. The charge generation layer sequence 8 serves as a charge carrier pair generation zone for electrons and holes which can be emitted into the first and second organic light emitting layers 51, 52 in accordance with the polarity of the organic functional layer stack. By way of example, the charge generation layer sequence 8 has an intermediate layer arranged between an n doped layer and a p doped layer. As an alternative thereto, the charge generation layer sequence can, for example, also have only an n doped and p doped layer. The n and p doped layers can be present in addition to the charge carrier conducting layers 42, 61 directly adjoining the charge generation layer sequence 8 or can alternatively also be formed by said layers.

In the exemplary embodiment of the organic light emitting component 100 as shown here, the intermediate layer is embodied in a transparent fashion, that is to say with an absorption coefficient k that is less than or equal to 0.005 for wavelengths of greater than 450 nm, that is to say in the visible spectral range. For this purpose, the intermediate layer of the charge generation layer sequence 8 comprises either a material, for example, an organic material or a metal oxide, which is highly transparent or which, in the case of a material that is not highly transparent, has a layer thicknesses of preferably greater than or equal to 2 nm and less than or equal to 4 nm, particularly preferably of approximately 2 nm. By way of example, the intermediate layer can be formed by a highly transparent undoped layer.

The first organic light emitting layer 51 comprises at least one organic material which emits light in a visible wavelength range during the operation of the organic light emitting component 100, the operation being indicated by the schematically indicated interconnection of the electrodes 3 and 7. In this case, the first organic light emitting layer 51 can comprise one or more of the materials mentioned above in the general part. In particular, the first organic light emitting layer 51 comprises arbitrarily, that is to say isotropically, arranged emitter molecules. That can mean that the isotropically arranged emitter molecules of the first organic light emitting layer 51 comprise or are emitter molecules having an isotropic molecular structure. Furthermore, that can also mean that the arbitrarily or isotropically arranged emitter molecules of the first organic light emitting layer 51 comprise or are emitter molecules having an anisotropic molecular structure that are arranged isotropically, that is to say not predominantly along a preferred direction or in a preferred plane.

The second organic light emitting layer 52 comprises anisotropically oriented emitter molecules having an anisotropic molecular structure. That means that the emitter molecules of the second organic light emitting layer 52 do not have a substantially spherical molecular structure, but rather, for example, an elongated molecular structure. For this purpose, the emitter molecules having an anisotropic molecular structure comprise, for example, at least two kinds of different ligands, for example, ligands which differ with regard to their atoms coordinated to a central atom, or have a square planar environment of the central atom.

In the exemplary embodiment shown, the second organic light emitting layer 52 comprises a phosphorescent emitter material having an anisotropic molecular structure, which material is selected from iridium complexes, platinum complexes, palladium complexes or from mixtures thereof. Alternatively or additionally, the second organic light emitting layer 52 can also comprise one or more other anisotropic emitter materials mentioned above in the general part. The anisotropic emitter molecules can be embedded or contained in a matrix material of the second organic light emitting layer 52, which matrix material can have an isotropic or preferably likewise an anisotropic molecular structure and can comprise or be composed of, for example, one or more of the matrix materials mentioned above in the general part.

The emitter molecules of the second organic light emitting layer 52 and in particular the dipole moments thereof described above in the general part are oriented substantially parallel in the exemplary embodiment shown, in particular parallel to the extension plane of the second organic light emitting layer 52. The advantage of such an anisotropically oriented emitter material and of the dipole moments is also explained further below in connection with FIG. 3.

The arrangement of two organic light emitting layers 51, 52 in the organic light emitting component 100 shown results in a degree of freedom in the respective arrangement of the light emitting layers 51, 52. This makes it possible to arrange the two organic light emitting layers 51, 52 in each case at an optimum distance from the reflective electrode 7, wherein the total layer thickness of the organic light emitting component 100 can be kept as thin as possible, as a result of which absorption losses in the organic functional layers can be kept small.

The distance between the first organic light emitting layer 51 and the reflective electrode 7 is greater than or equal to 150 nm and preferably greater than or equal to 180 nm. That means, in particular, that the organic functional layers arranged between the first organic light emitting layer 51 and the reflective electrode 7 had a total thickness corresponding to the distance mentioned. Taking account of the customary refractive indexes in the organic functional layer stack, the optical length between the first organic light emitting layer 51 and the reflective electrode 7 given a wavelength of 600 nm, for example, is particularly preferably greater than or equal to 1.6-150 nm and less than or equal to 1.8-225 nm. In particular, a range of between 150 nm and 225 nm and preferably between 180 nm and 220 nm, in each case inclusive of the limits, has proved to be particularly advantageous.

The second organic light emitting layer 52 is at a distance of greater than or equal to 30 nm and less than or equal to 100 nm from the reflective electrode 7. That can mean, in particular, that the organic functional layers of the organic functional layer stack that are arranged between the second organic light emitting layer and the reflective electrode have a total thickness of greater than or equal to 30 nm and less than or equal to 100 nm. In particular, this distance can be given substantially by the total thickness of the electron conducting layer 62, which, in the exemplary embodiment shown, is arranged between the second organic light emitting layer 52 and the reflective electrode 7, and, if appropriate, of a hole blocking layer arranged between the second organic light emitting layer 52 and the electron conducting layer 62.

Taking account of the customary refractive indexes in the organic functional layer stack, the optical length between the second organic light emitting layer 52 and the reflective electrode 7 given a wavelength of 600 nm, for example, is particularly preferably greater than or equal to 1.6 times 30 nm and less than or equal to 1.8 times 100 nm. Particularly preferably, the distance between the second organic light emitting layer 52 and the reflective electrode 7 is greater than or equal to 30 nm and less than or equal to 60 nm.

As a result of the organic functional layers arranged between the two light-emitting layers 51, 52, that is to say the charge carrier conducting layers 42 and 61 and the charge generation layer sequence 8 in the exemplary embodiment shown, the distance between the two light emitting layers 51, 52 is approximately 100 to 200 nm.

The herein described distances between the organic light emitting layers 51, 52 and the reflective electrode 7, which distances are chosen in a targeted manner, together with the optical coupling out layer 2, can bring about a significant increase in efficiency in comparison with known OLEDs. This becomes apparent in particular in association with FIG. 2, which is based on a simulation of a conventional green emitting OLED provided with one light emitting layer, on a standard glass substrate without an optical coupling out layer or other coupling out measures. The light-emitting layer taken as a basis in FIG. 2 comprises, in particular, isotropically arranged emitter molecules.

Figure 2:
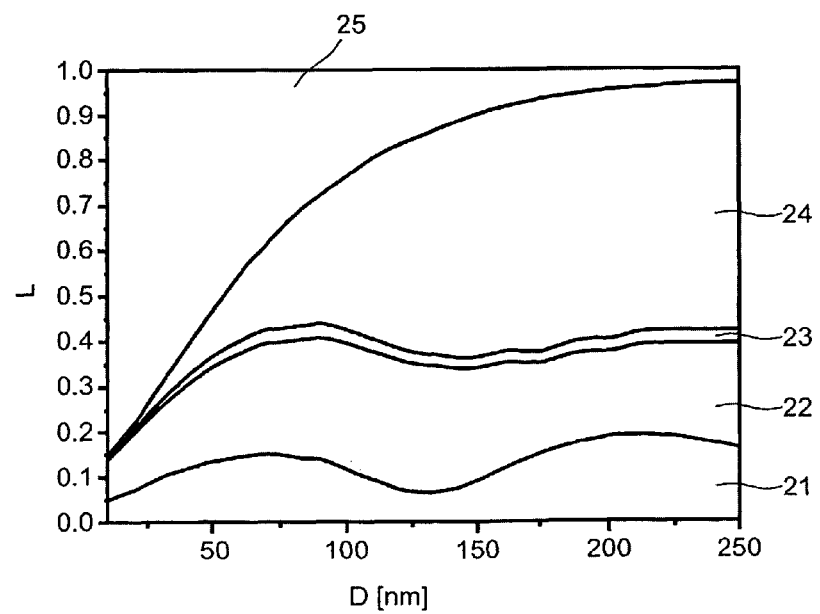
FIG. 2 shows a schematic illustration of relative proportions of coupling out and loss channels of the radiation power generated in the active layer of a conventional OLED.

FIG. 2 shows, as a function of the thickness D of the layer or layers arranged between the light-emitting layer and the reflective electrode, which corresponds to the distance between the reflective electrode and the light emitting layer, the relative proportions L of the coupling out and loss channels of the light generated in the light emitting layer. In this case, the shown relative proportions of the coupling out and loss channels should not be understood as restrictive for the exemplary embodiments described here and can vary depending on the construction and choice of material of the individual components.

The region 21 identifies that relative proportion of the light which is coupled out from the translucent substrate. The region 22 corresponds to that relative proportion of the light which is guided in the glass substrate by means of waveguiding. The region 23 identifies that relative proportion of the light which is lost as a result of absorption in the organic layers, the translucent electrode and the substrate. The region 24 identifies that relative proportion of the light which is guided in the translucent electrode and the organic layers as a result of waveguiding effects. The region 25 identifies that proportion which is lost by means of surface plasmons being coupled into the reflective electrode.

It is evident that the relative proportion of the light 21 that is coupled out from the substrate rises slightly in each case starting from a value for D of approximately 30 nm and of approximately 150 nm, while the loss channel caused by plasmons being coupled in, that is to say the region 25, decreases considerably mainly as the value for D rises, as a result of which the relative proportion of the light guided in the organic layers and the translucent electrode rises. In particular, the proportion 25 of the plasmon loss channel is less than 10% for a value of D of greater than or equal to 150 nm.

As a result of the additional optical coupling out layer 2 present in the organic light emitting component 100 described here, in particular that proportion of the light which is guided in the translucent electrode 3 and the organic layers can be at least partly coupled out. With regard to FIG. 2, this applies in particular in the case of a distance D of greater than or equal to 150 nm and less than or equal to 225 nm between the first organic light emitting layer 51 and the reflective electrode 7, where there is the maximum of the region 21, that is to say of the proportion of the light coupled out directly from the substrate, with at the same time a small plasmon loss proportion 25. As a result of the arrangement of the first organic light emitting layer 51 with such a distance, therefore, with regard to the light generated in the first organic light emitting layer 51, it is possible to achieve a significant increase in efficiency as a result of increased coupling out of light for the organic light-emitting component described here.

In addition to the first organic light emitting layer 51, the second organic light emitting layer 52 is positioned advantageously with regard to FIG. 2 in the region of the further maximum of the region 21 at values of D of between approximately 30 nm and approximately 100 nm, this arrangement likewise already resulting in an increased coupling out efficiency for the light generated in the second organic light emitting layer 52.

Figure 3:
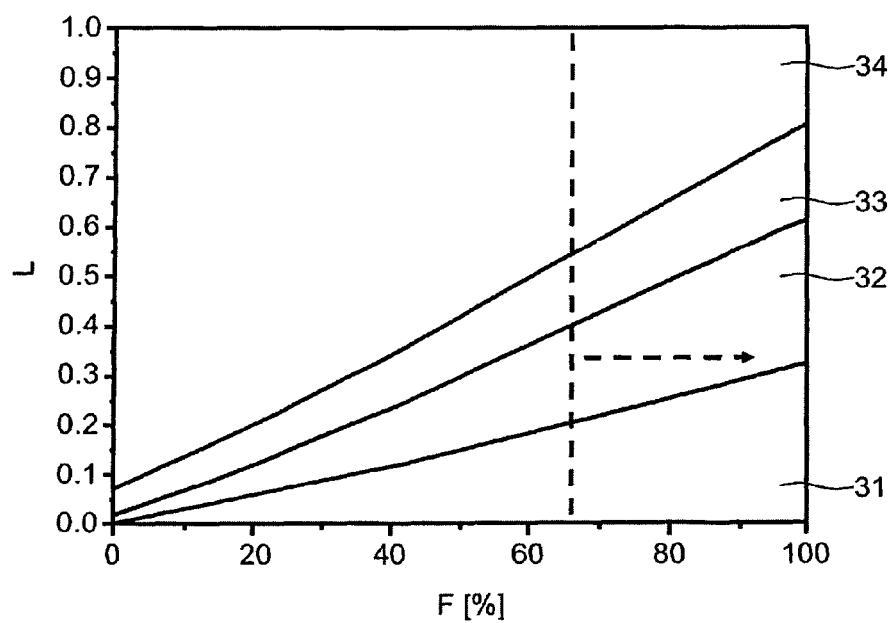
FIG. 3 shows a schematic illustration of relative proportions of coupling out and loss channels of the radiation power generated in an organic light emitting layer as a function of the proportion of the emitter molecules oriented parallel.

In addition to the advantageous spatial arrangement of the second organic light emitting layer 52, the latter, as described above, comprises the emitter molecules having the anisotropic molecular structure which are oriented anisotropically and particularly preferably parallel, wherein, in particular, the dipole moments of the emitter molecules are oriented parallel or substantially parallel, as a result of which losses as a result of plasmon excitations in the reflective electrode can be suppressed further, as is also apparent in association with FIG. 3.

FIG. 3 shows a simulation of a conventional OLED as in FIG. 2, the proportion F of the dipole moments which are oriented parallel being considered here. In this case, the shown relative proportions of the coupling out and loss channels should not be understood as restrictive for the exemplary embodiments described here and can vary depending on the construction and choice of material of the individual components.

The region 31 identifies that relative proportion of the light which is coupled out from the translucent substrate. The region 32 corresponds to that relative proportion of the light which is guided in the glass substrate by means of waveguiding. The region 33 identifies that relative proportion of the light which is guided in the translucent electrode and the organic layers as a result of waveguiding effects. The region 34 identifies that proportion which is lost by means of surface plasmons being coupled into the reflective electrode.

The dashed vertical line identifies a relative proportion of dipole moments oriented parallel of ⅔ or approximately 66%, which corresponds to an isotropic distribution of the anisotropic emitter molecules. An increase in the proportion oriented parallel is thus achieved along the arrow depicted in a dashed fashion.

It is evident that the plasmon loss channel identified by the region 34 decreases with increasing anisotropic and in particular parallel arrangement of the dipole moments, with the result that at the same time, as has already been explained in conjunction with FIG. 2, the relative proportion of the light guided in the organic layers and the translucent electrode increases. As a result of the above described coupling out of at least part of this proportion through the optical coupling out layer 2, the light power of the light generated in the second organic light emitting layer 52, said light power being emitted through the substrate, can be increased in comparison with known OLEDs comprising typically isotropically and non directionally arranged emitter molecules.

The construction—chosen and optimized in a targeted manner of the herein described organic light emitting component in particular with regard to the arrangement of the two light emitting layers and the emitter materials thereof thus leads to a significant increase in efficiency and improvement in the coupling out of light.

In addition to the first and second organic light emitting layers 51, 52 shown in the exemplary embodiments, at least one or else a plurality of further organic light emitting layers can be arranged between the translucent electrode 3 and the first organic layer 51, such that the organic light emitting component 100 shown in FIG. 1 can, for example, also comprise three, four or more organic light emitting layers between the electrodes 3, 7. A respective charge generation layer can be arranged between respectively adjacent organic light emitting layers, that is to say, for example, between the first organic light emitting layer 51 and a further organic light emitting layer.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic light-emitting component, comprising:
a translucent substrate;
an optical coupling-out layer overlying the translucent substrate;
a translucent electrode overlying the coupling-out layer;
an organic functional layer stack comprising:
a first organic light-emitting layer overlying the translucent electrode, wherein the first organic light-emitting layer comprises arbitrarily arranged emitter molecules;
a second organic light-emitting layer overlying the first organic light-emitting layer, wherein the second organic light-emitting layer comprises anisotropically oriented emitter molecules having an anisotropic molecular structure; and
a reflective electrode overlying the organic function layer stack.

2. The component according to claim 1, wherein the first organic light-emitting layer is at a distance of greater than or equal to 150 nm and less than or equal to 225 nm from the reflective electrode.

3. The component according to claim 1, wherein the second organic light-emitting layer is at a distance of greater than or equal to 30 nm and less than or equal to 100 nm from the reflective electrode.

4. The component according to claim 1, wherein a distance between the first organic light-emitting layer and the reflective electrode is chosen such that a relative proportion of radiation power generated in the first organic light-emitting layer is less than or equal to 10%, the relative proportion being the proportion of radiation coupled into the reflective electrode in the form of plasmons.

5. The component according to claim 1, wherein the anisotropically oriented emitter molecules have transition dipole moments, more than 66% of the transition dipole moments being oriented parallel.

6. The component according to claim 1, further comprising a charge generation layer sequence arranged between the first and second organic light-emitting layers.

7. The component according to claim 6, wherein the charge generation layer sequence has an n-doped region, p-doped region, and an intermediate layer having a thickness of less than or equal to 4 nm arranged between the n-doped region and the p-doped region.

8. The component according to claim 1, wherein the second organic light-emitting layer comprises a matrix material in which the anisotropically oriented emitter molecules are arranged.

9. The component according to claim 8, wherein the matrix material of the second organic light-emitting layer has an anisotropic molecular structure.

10. The component according to claim 1, wherein the organic functional layer stack comprises at least one organic functional layer which is thicker than 5 nm and which has an absorption coefficient k of less than or equal to 0.005 for part of the visible spectral range.

11. The component according to claim 1, wherein the translucent electrode has an absorption coefficient k of less than or equal to 0.005 for part of the visible spectral range and a total transmission in the visible spectral range of greater than or equal to 80%.

12. The component according to claim 1, wherein the reflective electrode has a reflectivity of greater than or equal to 80% in the visible spectral range.

13. The component according to claim 1, wherein the optical coupling-out layer has a refractive index that is greater than or equal to a layer-thickness-weighted average refractive index of the organic functional layers and the translucent electrode.

14. The component according to claim 1, wherein the optical coupling-out layer is light-scattering.

15. The component according to claim 1, wherein at least one or more further organic light-emitting layers are arranged between the translucent electrode and the first organic light-emitting layer.

16. An organic light-emitting component, comprising:
a translucent substrate;
an optical coupling-out layer is overlying the translucent substrate;

a translucent electrode overlying the coupling-out layer;
an organic functional layer stack comprising:
- a first organic light-emitting layer overlying the translucent electrode, wherein the first organic light-emitting layer comprises arbitrarily arranged emitter molecules;
- a second organic light-emitting layer overlying the first organic light-emitting layer, wherein the second organic light-emitting layer comprises anisotropically oriented emitter molecules having an anisotropic molecular structure and a matrix material in which the anisotropically oriented emitter molecules are arranged; and
- a reflective electrode overlying the organic functional layer stack.

* * * * *